(12) United States Patent
Doyle

(10) Patent No.: US 7,435,637 B2
(45) Date of Patent: Oct. 14, 2008

(54) QUANTUM WIRE GATE DEVICE AND METHOD OF MAKING SAME

(75) Inventor: Brian Doyle, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 650 days.

(21) Appl. No.: 11/105,087

(22) Filed: Apr. 12, 2005

(65) Prior Publication Data
US 2005/0215040 A1 Sep. 29, 2005

Related U.S. Application Data

(62) Division of application No. 09/516,653, filed on Mar. 1, 2000, now Pat. No. 6,967,140.

(51) Int. Cl.
*H01L 21/336* (2006.01)
(52) U.S. Cl. .................. 438/197; 438/282; 438/303; 438/533; 438/156; 438/962
(58) Field of Classification Search .......... 438/524, 438/533, 282, 297, 424, 932, 962, 585, 595, 438/268, 156, 197; 257/257, E29.069–E29.071, 257/E29.245, E49.001–E49.004, E21.404
See application file for complete search history.

(56) References Cited

U.S. PATENT DOCUMENTS

| 5,529,952 | A | * | 6/1996 | Smith et al. ............. 438/380 |
| 5,612,255 | A | | 3/1997 | Chapple-Sokol et al. |
| 5,828,076 | A | * | 10/1998 | Gossner et al. ............. 257/24 |
| 6,063,688 | A | * | 5/2000 | Doyle et al. ............. 438/424 |
| 6,399,502 | B1 | * | 6/2002 | Hernandez et al. .......... 438/692 |
| 6,967,140 | B2 | * | 11/2005 | Doyle ......................... 438/282 |
| 7,183,597 | B2 | * | 2/2007 | Doyle ......................... 257/224 |
| 2003/0006410 | A1 | * | 1/2003 | Doyle ........................ 257/20 |
| 2005/0158959 | A1 | * | 7/2005 | Doyle ......................... 438/303 |
| 2005/0215040 | A1 | * | 9/2005 | Doyle ......................... 438/585 |

OTHER PUBLICATIONS

Kendall, D.L. "Far Beyond Microelectronics with Silicon", The Norbert J. Kreidl Memorial Lecture, Holiday Inn Midtown, Oct. 30, 1995, section meeting MRS, ECS and RCS.

* cited by examiner

*Primary Examiner*—M. Wilczaewski
*Assistant Examiner*—Swapneel Chhaya
(74) *Attorney, Agent, or Firm*—George Chen

(57) ABSTRACT

The present invention relates to a method of forming a quantum wire gate device. The method includes patterning a first oxide upon a substrate. Preferably the first oxide pattern is precisely and uniformly spaced to maximize quantum wire numbers per unit area. The method continues by forming a first nitride spacer mask upon the first oxide and by forming a first oxide spacer mask upon the first nitride spacer mask. Thereafter, the method continues by forming a second nitride spacer mask upon the first oxide spacer mask and by forming a plurality of channels in the substrate that are aligned to the second nitride spacer mask. A dielectric is formed upon the channel length and the method continues by forming a gate layer over the plurality of channels. Because of the inventive method and the starting scale, each of the plurality of channels is narrower than the mean free path of semiconductive electron flow therein.

6 Claims, 8 Drawing Sheets

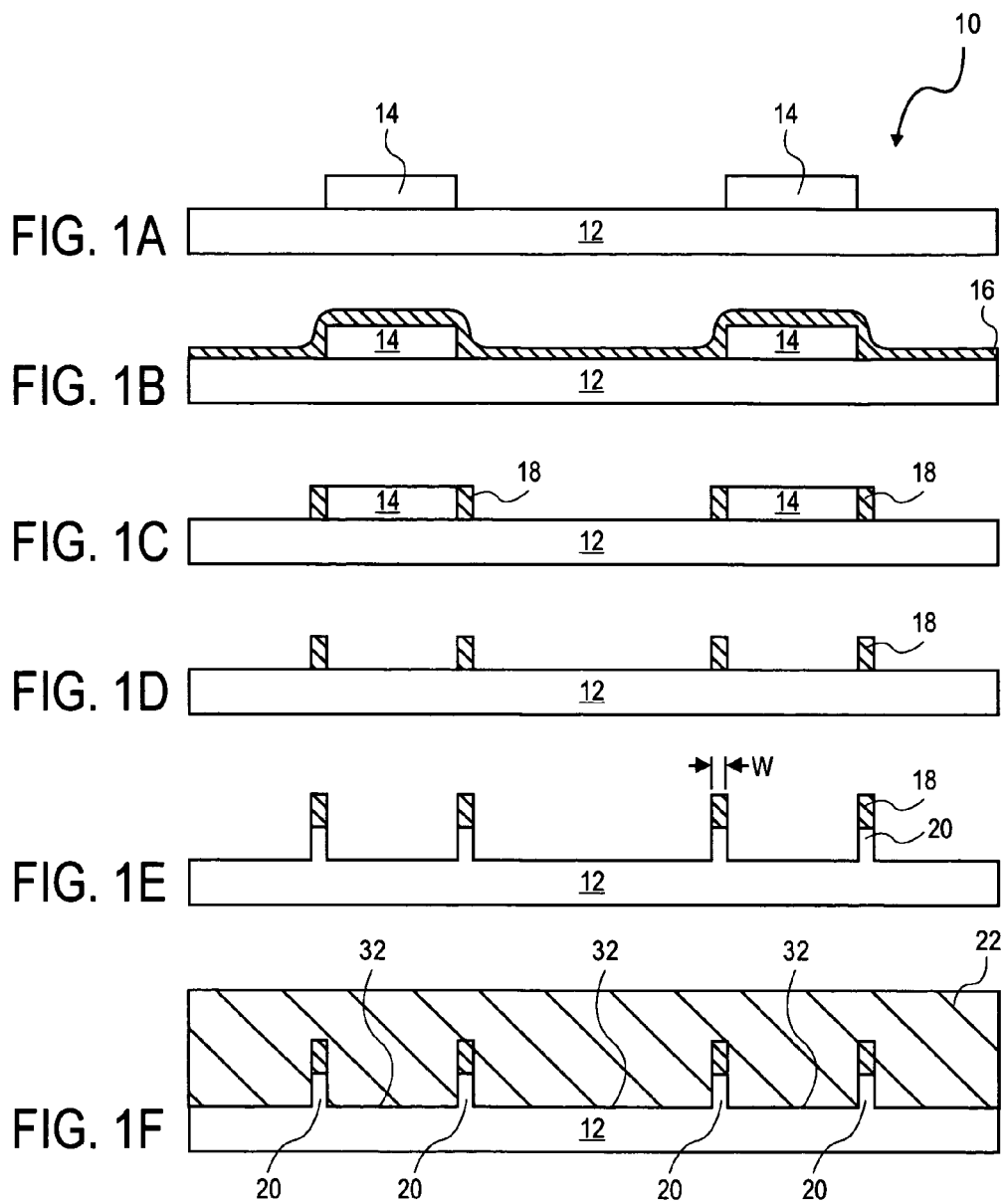

ND METHOD OF MAKING SAME

QUANTUM WIRE GATE DEVICE AND METHOD OF MAKING SAME

This is a Divisional Application of Ser. No. 09/516,653, filed on Mar. 1, 2000, which was issued on Nov. 22, 2005 as U.S. Pat. No. 6,967,140.

BACKGROUND OF THE INVENTION

1. Field of the Invention

The present invention relates generally to integrated circuit fabrication, and, more specifically, the present invention relates to the fabrication of quantum wire gate structures that are spacer-width patterned.

2. Description of Related Art

During the tunneling of an electron from a source to a drain in a typical semiconductive transaction, an electron will suffer a number of collisions between source and drain that cause the electron path length to increase. Because electron flow is constant velocity, the longer electron path hinders the effective transition time thereof. With the advent of quantum wire devices, an electron is allowed only to suffer collisions that will be confined within the extremely narrow channel, including collisions at the interface between channel and contiguous dielectric. Thus, where the narrow channel has a width the is less than the mean free path (MFP) of the electron, conservation of momentum law dictates a more direct route through the channel and a faster transition time from source to drain.

A field effect transistor (FET) is a fundamental building block of integrated circuits. Where metal oxide on silicon (MOS) devices are approaching the limits of scaling based upon known fundamental technique, optimization of different components has allowed the FET to continue in the process of miniaturization. The decrease in supply voltage, however, has caused acceptable performance in the 0.7× scaling to become increasingly elusive. What is needed is a method of achieving gate dimensions that overcome scaling limits of the prior art.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which:

FIG. 1a is an elevational cross-section fractional view that depicts preliminary fabrication of a first layer for a quantum wire, double gate device;

FIG. 1b is an elevational cross-section fractional view of the device depicted in FIG. 1a after further processing;

FIG. 1c illustrates further processing of the device in FIG. 1b in which a spacer etch has been accomplished;

FIG. 1d illustrates further processing wherein a first layer has been removed to leave a spacer mask;

FIG. 1e illustrates further processing wherein a quantum wire has been formed in a semiconductive substrate;

FIG. 1f illustrates further processing of the device depicted in FIG. 1e, wherein the quantum wire has been overlaid with a gate layer;

FIG. 3b depicts further processing of the structure depicted in FIG. 3a;

DETAILED DESCRIPTION OF THE INVENTION

Figure 2A:
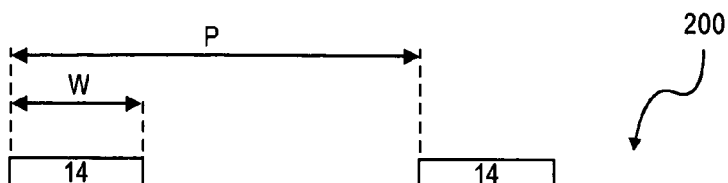
FIG. 2a is an elevational cross-section view of a substrate with a patterned oxide disposed thereon that has been precisely spaced apart.

The following description includes terms, such as upper, lower, first, second, etc. that are used for descriptive purposes only and are not to be construed as limiting. The embodiments of an apparatus or article of the present invention described herein can be manufactured, used, or shipped in a number of positions and orientations.

Reference will now be made to the drawings wherein like structures will be provided with like reference designations. In order to show the structures of the present invention most clearly, the drawings included herein are diagrammatic representations of integrated circuit structures. Thus, the actual appearance of the fabricated structures, for example in a photomicrograph, may appear different while still incorporating the essential structures of the present invention. Moreover, the drawings show only the structures necessary to understand the present invention. Additional structures known in the art have not been included to maintain the clarity of the drawings.

FIG. 1a is an elevational cross-section fractional view of a larger structure that depicts preliminary fabrication of a quantum wire, spacer double gate device, depicted herein by reference numeral 10. Device 10 is fabricated by providing a substrate 12 and by patterning a first oxide 14 upon substrate 12. First oxide 14 has a characteristic width and a characteristic pitch. FIG. 1b illustrates formation of a first nitride layer 16 over first oxide 14 and substrate 12. First nitride layer 16 has a thickness in a range from about 5 nm to about 20 nm, preferably about 10 nm. First nitride layer 16 may be deposited by chemical vapor deposition (CVD), by physical vapor deposition (PVD), by nitridation of a PVD or CVD metal layer, or by other known methods. One method of forming first nitride layer 16 is to directly form a nitride layer upon substrate 12 and first oxide 14 by CVD or PVD of a nitride such as a metal nitride. Preferably, first nitride layer 16 is formed by CVD of a refractory metal nitride such as silicon nitride.

Another method of forming first nitride layer 16 is to directly form a nitride layer upon substrate 12 and first oxide 14 by CVD or PVD of a nitride such as a refractory metal nitride. The metal nitride may be selected from any suitable metal according to a preferred usage. First nitride layer 16 may be formed by CVD of a refractory metal nitride such as titanium nitride.

A spacer etch is performed upon device 10 as depicted in FIG. 1c to form a patterned first nitride spacer mask 18. Spacer etching is carried out by anisotropic etching, preferably by reactive ion etching (RIE). The RIE has an etch recipe that is selective to substrate 12 and to first oxide 14 over first nitride layer 16. The etch recipe may have a selectivity above about 2:1, preferably above about 10:1.

After the formation of first nitride spacer mask 18, first oxide layer 14 is removed by an etch that is selective to substrate 12 and to first nitride spacer mask 18. The result of this etch is depicted in FIG. 1d. Preferably, the etch is a wet etch as is known in the art. Preferably selectivity of the etch recipe of oxide 14 and substrate 12-to-first nitride spacer mask 18 in range from about 2:1 to about 10:1 or greater.

FIG. 1e illustrates further processing of structure 10. An anisotropic etch has been carried out on substrate 12 with the use of first nitride spacer mask 18. Etching into substrate 12 is carried out under conditions that will allow the formation of a quantum wire 20. Quantum wire 20 has the property of having a width W, defined by the thickness of layer 16, that is smaller than the mean free path of electrons that flow therein under semiconductive conditions. Quantum wire 20 may be an integral part of substrate. Even though doping of substrate 12 and of quantum wire 20 may be identical, due to the multiple gate structure and/or the proximity of semiconductive channels in a double gate configuration, a semiconductive transaction occurs only in quantum wire 20. This phenomenon will be set forth below.

FIG. 1f illustrates further processing of structure 10 depicted in FIG. 1e, wherein quantum wire 20 has been overlaid with a gate layer 22. Gate layer 22 is preferably a metal-like material such as heavily p- or n-doped (e.g. about $1 \times 10^{20}/cm^3$) or undoped polycrystalline silicon. It may also be a metal. In a preferred embodiment gate layer 22 may be formed by CVD followed by planarization such as by chemical-mechanical polishing (CMP). In this embodiment, quantum wire 20 forms a first semiconductive channel that is spaced apart from a second semiconductive channel 20 by a trench 32 that is greater than the channel width, preferably less than about five times the semiconductive channel width.

In some embodiments of the present invention, it is preferable to achieve a series of closely-spaced quantum wires in order to allow a contact to make electrical connection a maximum number of quantum wires, relative to the characteristic width of the contact. Where a contact has reached a cross-sectional area limit in the range from about 150 nm to about 250 nm. a maximum number of quantum wires can be formed beneath a contact that will facilitate a drive current such as a bit line communication through the quantum wires.

In accordance with the present invention, a method of forming a device with uniform and closely spaced quantum wires is provided. FIG. 2a is an elevational cross-section view of a structure 200 that includes a substrate 12 with a patterned first oxide 14 disposed thereon. Patterned first oxide 14 is precisely spaced apart to allow crowding of quantum wires into a minimum area. In one embodiment, patterned first oxide 14 has a characteristic width, W, in a range from about 50 nm to about 200 nm, preferably about 100 nm. Patterned first oxide has a characteristic pitch, P, in a range from about 150 nm to about 600 nm, preferably about 300 nm.

Figure 2B:
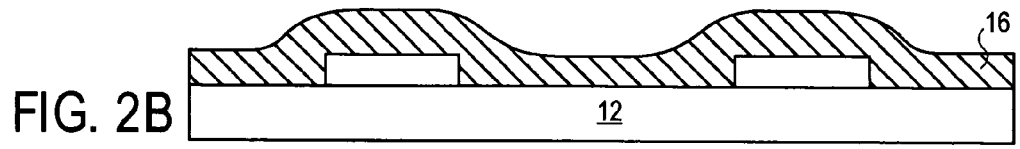
FIG. 2b is an elevational cross-section view that depicts further processing of the structure depicted in FIG. 2a, wherein a nitride layer has been formed over the substrate and patterned oxide.

FIG. 2b is an elevational cross-section view that depicts further processing of structure 200 depicted in FIG. 2a, wherein a first nitride layer 16 has been formed over substrate 12 and patterned first oxide 14. First nitride layer 16 may be any nitride layer suitable for a given application, and as set forth herein. First nitride layer 16 is preferably formed at a characteristic thickness that will result in a spacer width that is about an integer fraction of characteristic width W. For example, where W is about 100 nm, first nitride layer 16 is formed at a characteristic thickness of about 50 nm.

Figure 2C:
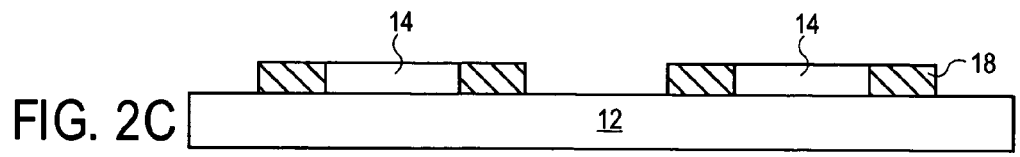
FIG. 2c depicts further processing, wherein a spacer etch has left uniformly spaced-apart first nitride spacer masks.

FIG. 2c depicts further processing of structure 200 depicted in FIG. 2b, wherein a spacer etch has left uniformly spaced-apart first nitride spacer masks 18 upon patterned first oxide layer 14. Removal of patterned first oxide layer 14 is next carried out by an etch that is selective to substrate 12 and to first nitride spacer masks 18. Etching to remove patterned first oxide layer 14 is carried out as set forth herein. Where W is about 100 nm, and first nitride layer 16 has a characteristic thickness of about 50 nm, uniformly spaced-apart first nitride spacer mask 18 may have a width of about 50 nm.

Figure 2D:
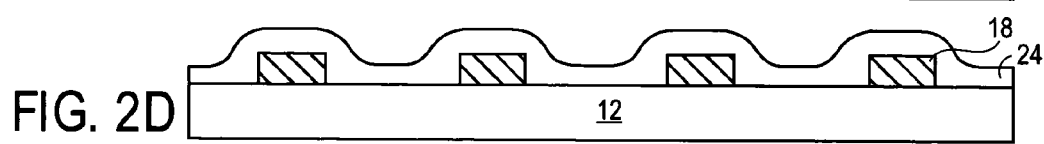
FIG. 2d depicts further processing after removal of the patterned oxide layer, followed by formation of a second oxide layer.
Figure 2E:
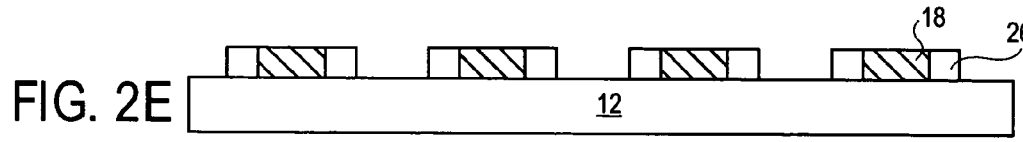
FIG. 2e depicts further processing, wherein a spacer etch has formed uniformly-spaced-apart oxide spacer masks.

FIG. 2d depicts further processing of structure 200 depicted in FIG. 2c after removal of patterned first oxide layer 14. In FIG. 2d, a second oxide layer 24 is formed over first nitride spacer mask 18. In this embodiment, second oxide layer 24 has a characteristic thickness of about 25 nm. A spacer etch is next performed upon the second oxide layer 24 as illustrated in FIG. 2e to form uniformly-spaced first oxide spacer masks 26. The etch type and etch recipe selectivites are used as set forth herein.

Figure 2F:
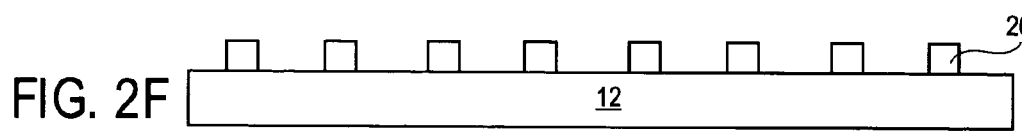
FIG. 2f illustrates further processing, wherein the first nitride spacers have been removed.

FIG. 2f illustrates further processing, wherein first nitride spacers 18 have been removed. First nitride spacer mask 18 is removed by an etch that may typically be wet. Preferably, the etch recipe will be selective to first oxide spacer mask 26 and to substrate 12.

Figure 2G:
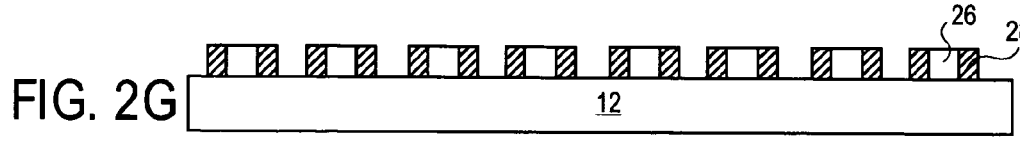
FIG. 2g illustrates further processing, wherein a second nitride layer has been formed and spacer etched.
Figure 2H:
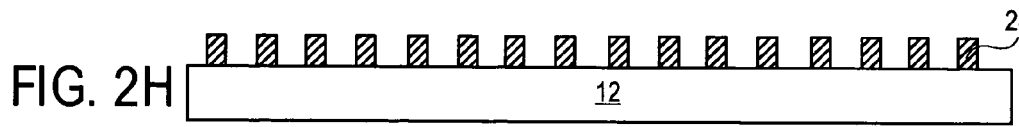
FIG. 2h illustrates further processing, wherein the oxide spacer masks have been removed to leave a plurality of uniformly spaced-apart second nitride spacer masks.

FIG. 2g illustrates further processing, wherein a second nitride layer has been formed and spacer etched to form a second nitride spacer mask 28. In this embodiment, the second nitride layer is about 10 nm thick and consequently, second nitride spacer mask 28 is about 10 nm wide. FIG. 2h illustrates further processing. Thereby, first oxide spacer mask 26 is removed by a wet etch or the like and with an etch recipe that is selective to second nitride spacer mask 28 and to substrate 12.

Figure 2I:
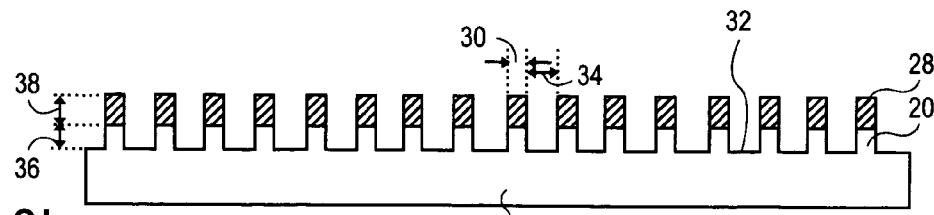
FIG. 2i illustrates further processing, wherein quantum wires have been formed beneath the second nitride spacer masks by etching into the substrate.

FIG. 2i illustrates further processing, wherein quantum wires 20 have been formed by etching into substrate 12. Where the characteristic width, W, was about 100 nm and the characteristic pitch, P, was about 300 nm, structure 10 has a plurality of quantum wires 20 that have a width 30 of about 10 nm. Additionally, quantum wires 20 are uniformly spaced apart by a trench 32 that has a trench width 34 of about 20 nm.

Other uniform spacing schemes may be accomplished according to the present invention. In one embodiment, W is about 100 nm and P is about 320 nm. By conducting the inventive method of this embodiment similar to the inventive method depicted in FIGS. 2a through 2i, trench width 34 and wire width 30 are of about equal length; in this embodiment each is about 10 nm.

Other dimensions of quantum wire 20 and of second nitride spacer mask 28 include the quantum wire height 36 and the second nitride spacer mask height 38. Preferably, quantum wire 20 is at least square in cross-sectional shape. Optionally, quantum wire 20 may have an aspect ratio of height 36-to-width 30 in a range from about 1.1 to about 5. Second nitride spacer mask 28 may be of any aspect ratio that is suited or incidental to a preferred fabrication scheme. Examples of the aspect ratio range include from about 0.2 to about 10. Preferably, second nitride spacer mask 28 has an aspect ratio of about 1 or greater. Structure 200 depicted in FIG. 2i may be further processed as set forth herein to form a quantum wire gate device.

Figure 3A:
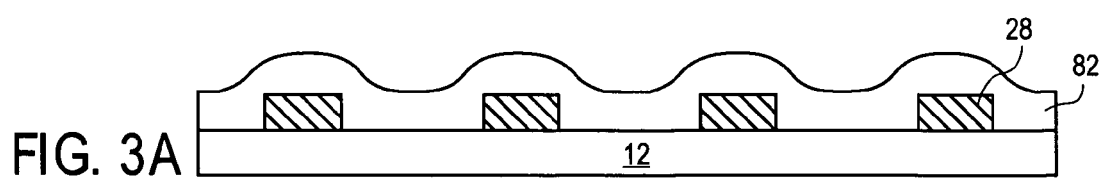
FIG. 3a is an elevational cross-section fractional view of a semiconductor structure that depicts another embodiment of the present invention.
Figure 3B:
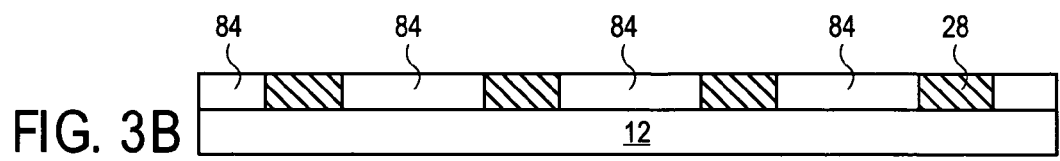
Figure 3C:
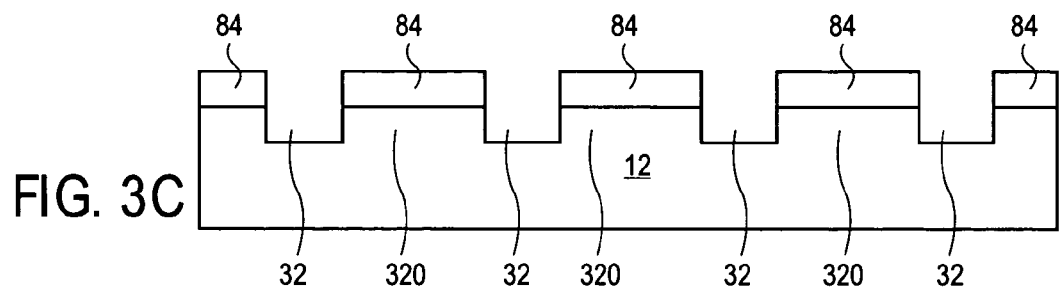
FIG. 3c depicts further processing of the structure depicted in FIG. 3b.

Another uniform spacing scheme may be accomplished according to the present invention as illustrated in FIG. 3a. In this embodiment, a structure such as second nitride spacer mask 28 is overlaid with a material such as an oxide layer 82. In FIG. 3b, oxide layer 82 has been planarized back to about the top of second nitride spacer mask 28 to form an oxide block 84. With oxide block 84 in place, a directional etch may be carried out to create a quantum wire 320 and a trench 32 that spaces apart two quantum wires 320. By conducting the inventive method of this embodiment similar to the inventive method depicted in FIGS. 2, trench 32 has a width that is less than the quantum wire width.

Figure 4:
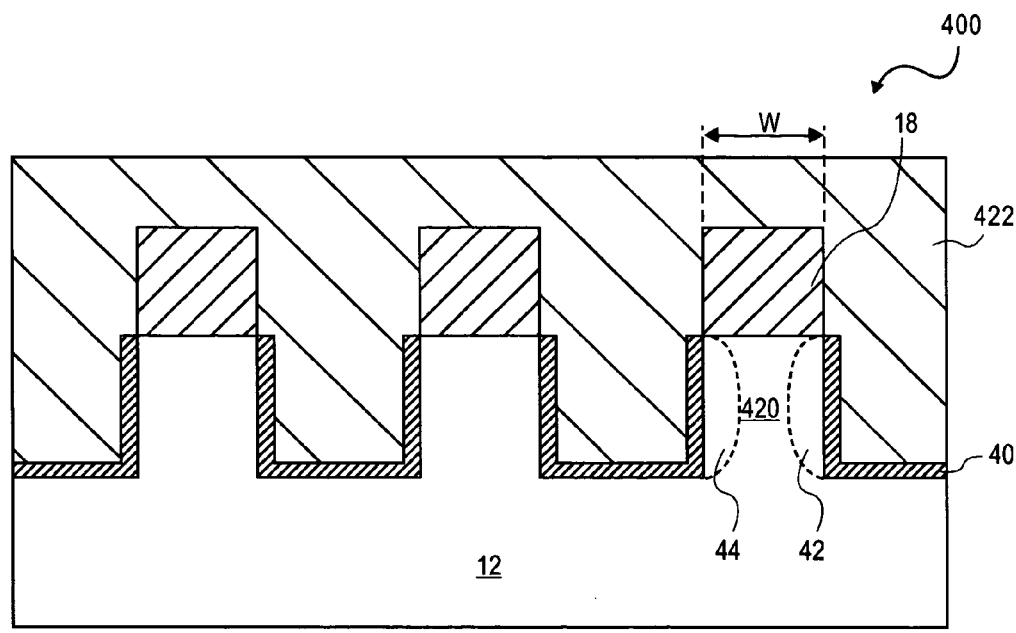
FIG. 4 is an elevational cross-section fractional view of an inventive quantum wire gate.

FIG. 4 is an elevational cross-section fractional view of an inventive quantum wire double gate 400. A double-gate quantum wire 420 comprises two semiconductive channels 42, 44 that are depicted by estimation phantom lines to delineate semiconductive transaction areas. As a whole, double-gate quantum wire 420 may be considered a semiconductive channel comprising a channel length and a channel width W. The channel length is orthogonal to the plane of the Figure. A dielectric layer such as a gate oxide layer 40 may be formed upon the semiconductive channel length as well as upon substrate 12. A gate layer 422 is disposed over the double-gate quantum wire 420.

Figure 5:
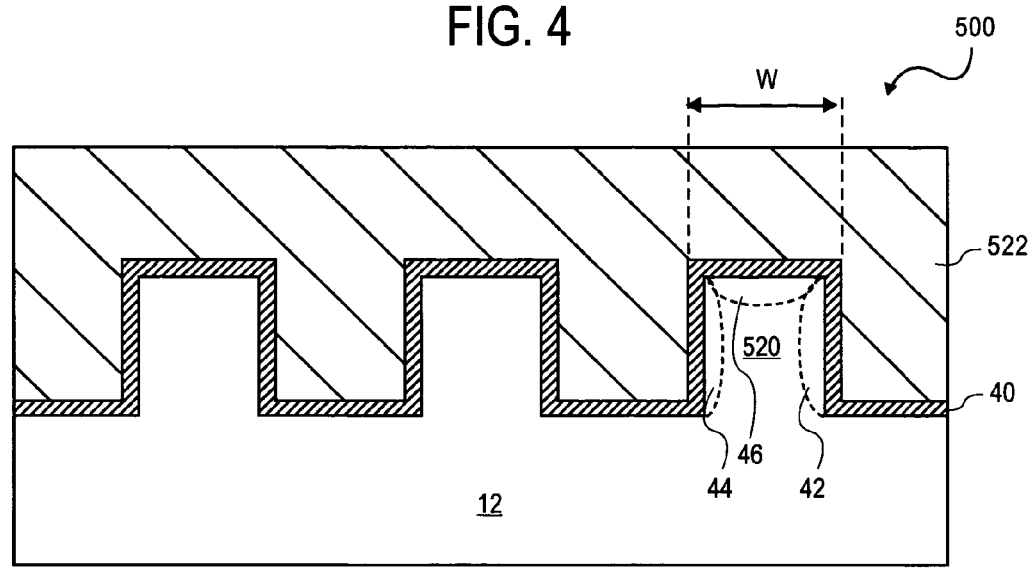
FIG. 5 is an elevational cross-section fractional view of an inventive quantum wire gate.

FIG. 5 is an elevational cross-section fractional view of an inventive quantum wire triple gate 500. A triple-gate quantum wire 520 comprises three semiconductive channels 42, 44, and 46 that are depicted by estimation with phantom lines to delineate semiconductive transaction areas. As a whole, triple-gate quantum wire 520 may be considered a semiconductive channel comprising a channel length and a channel width W. The channel length is orthogonal to the plane of the Figure. A dielectric layer such as a gate oxide layer 40 may be formed upon the semiconductive channel length and width as well as upon substrate 12. Quantum wire triple gate 500 comprises three semiconductive channels 42, 44, and 46. A gate layer 522 is disposed over the double-gate quantum wire 520.

Figure 6:
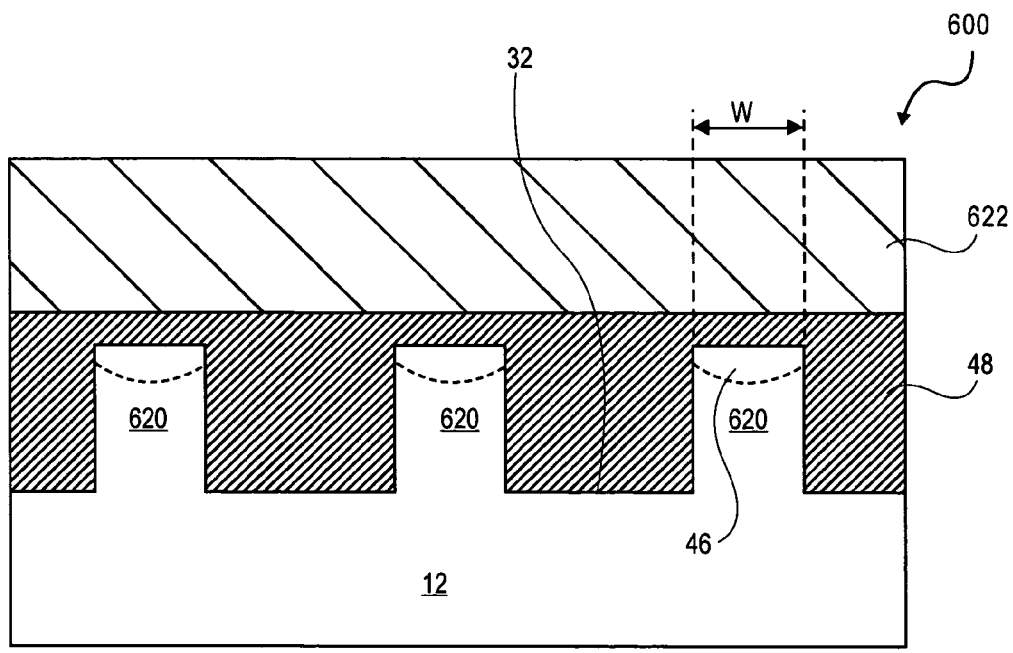
FIG. 6 is an elevational cross-section fractional view of an inventive quantum wire gate.

FIG. 6 is an elevational cross-section fractional view of an inventive quantum wire single gate 600. A single-gate quantum wire 620 comprises a single semiconductive channel 46 that is depicted by estimation with phantom lines to delineate a semiconductive transaction area. As a whole, single-gate quantum wire 620 may be considered a semiconductive channel comprising a channel length and a channel width W. The channel length is orthogonal to the plane of the Figure. A bulk dielectric layer 48 covers quantum wire 620 and fills trench 32 to a level above quantum wire 620 that allows for semiconductive activity in channel 46. A gate layer 622 is disposed over the double-gate quantum wire 620.

Figure 7:
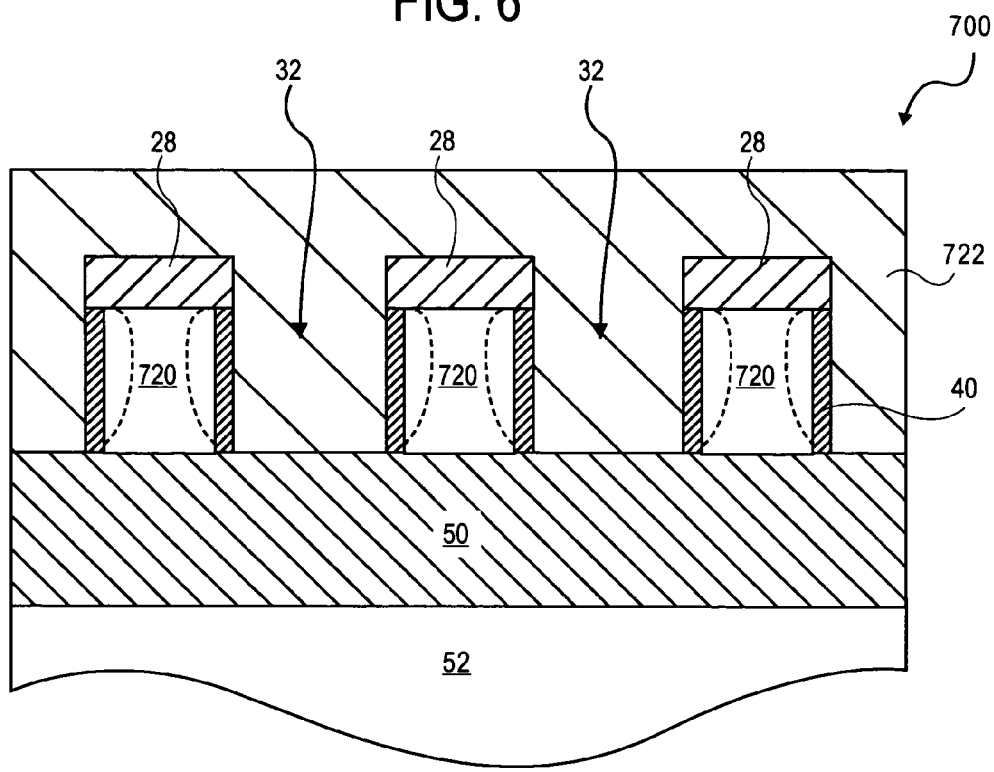
FIG. 7 is an elevational cross-section fractional view of an inventive quantum wire gate.

FIG. 7 depicts an inventive quantum wire, double gate structure 700 that is formed upon an insulator substrate 50. Some embodiments may preferably be a silicon on insulator (SOI) structure. An SOI structure completely isolates the quantum wire from any electrically conductive or semiconductive material such as where the substrate is a monocrystalline silicon. Typically in the structures depicted in FIGS. 1-6, semiconducting activity is limited to areas that are proximate the gate within the quantum wire. This limited semiconducting activity is either due to no other gate material being close enough to cause a field effect, or due to the collective effect of a first semiconductive area 42 being affected by electrical activity in a second semiconductive area 44 such as depicted in FIG. 4. In other words, semiconductive activity in one area of a quantum wire synergistically promotes the semiconductive activity of another area therewithin.

Because the channel interface with dielectric material of the multiple gate structure decreases compared to a conventional gate, the charge current may more than double. It is discovered that at a 10 nm wire width, the charge current can be greater than about twice that of a single gate channel instead of the expected doubled charge current. In one test series, double gate structures showed an increase in charge current over a single-gate structure. The results of the tests were about 2.2 times the charge current, about 2.35 times, about 2.47 times, and about 2.49 times.

FIG. 7 illustrates an SOI structure 700 that includes insulator substrate 50 that forms the SOI precursor set upon silicon 52. Therefrom, quantum wires 720 have been formed beneath a spacer mask such as second nitride spacer mask 28. In this embodiment, quantum wire 720 has been totally isolated from other electrically conductive or semiconductive material. A gate layer 722 is disposed over the double-gate quantum wire 720. It is understood that the SOI scheme may be applied in any of the embodiments set forth herein.

Figure 8:
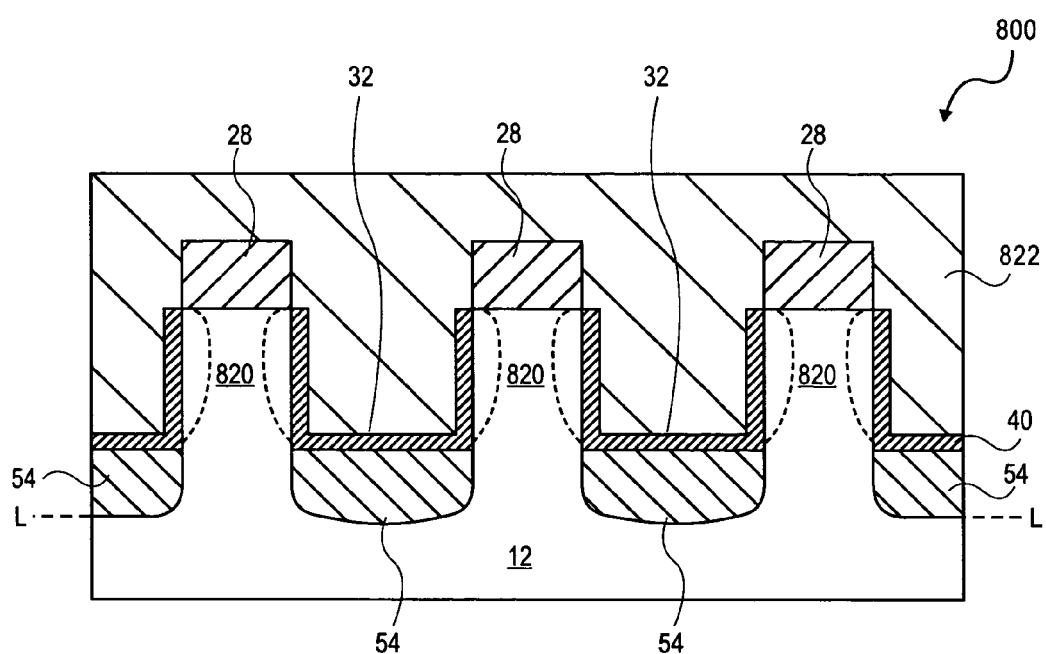
FIG. 8 is an elevational cross-section fractional view of an inventive quantum wire gate.

FIG. 8 represents an embodiment in which ion implantation is carried out to create doping regions 54 that are self-aligned beneath trenches 32 that lie between second nitride spacer masks 28. This structure 800 has an electrical isolation effect that is similar to an SOI structure. For example, where substrate 12 is n-doped, self-aligned doping region 54 is heavily n-doped such that n-type semiconductivity is hindered therein. In such a doping scheme, it is preferable to employ doping elements that are more resistive to diffusion during subsequent processing including burn-in. In an n-type doped substrate, self-aligned doping region 54 may be doped with arsenic and the like. Preferably, the dopant will resist thermal diffusion compared to other dopant elements of the same type. Doping regions 54 resist electrical communication between two adjacent quantum wires 820.

It now become apparent that combination of an SOI with a self-aligned doping region may be carried out. In this embodiment, an SOI quantum wire is constructed that does not achieve complete isolation of the wires from their silicon substrate. In other words, etching does not proceed to the extent that the etch stops on the insulator; it stops short of this etch depth. Isolation is approximated, however, by the implantation of a doping region as set forth above. The doping region may extend to the insulator substrate, or it may only extend to a depth that causes the quantum wires to be effectively isolated from their monocrystalline silicon substrate. In this embodiment, the plurality of quantum wires maintains a structural integrity with their monocrystalline silicon substrate, but they are effectively isolated from each other as well as from the substrate. This embodiment may be achieved by forming a structure such as structure 800 as depicted in FIG. 8, upon an insulator substrate such as insulator substrate 50, as depicted in FIG. 7.

Figure 9:
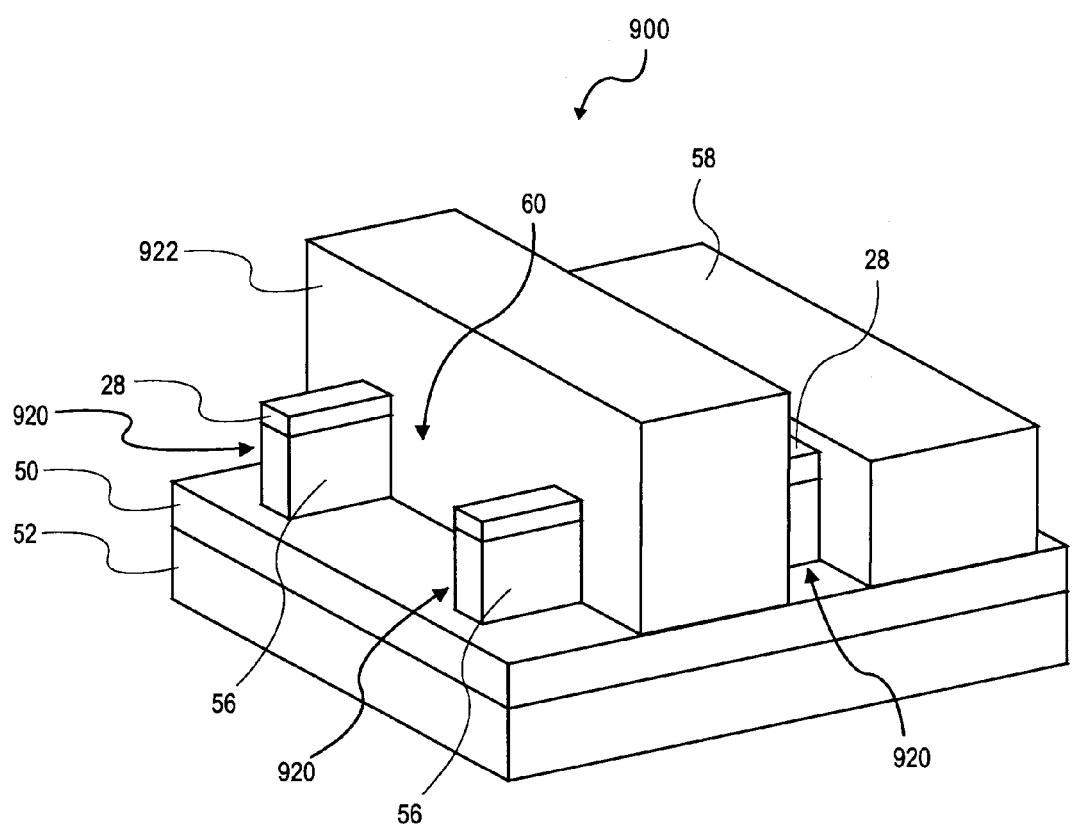
FIG. 9 is an elevational perspective view of an inventive quantum wire gate.

FIG. 9 is an elevational perspective view of an inventive quantum wire gate structure 900. A quantum wire 920 is disposed upon an insulator substrate 50. Quantum wire 920 has been patterned with the use of a spacer mask such as second nitride spacer mask 28. A gate layer 922 is disposed over quantum wire 920 and second nitride spacer mask 28 to create a quantum wire double gate in this embodiment. A gate oxide (not pictured) is formed upon the length 56 of quantum wire 920. An insulator 58 may also be formed. Additionally, where quantum wire 920 is to connect with a contact in a contact corridor, a gate spacer is to be formed between a contact landing area 60 and gate layer 22 by the traditional method of nitride/oxide deposition and an RIE spacer etch.

Figure 10:
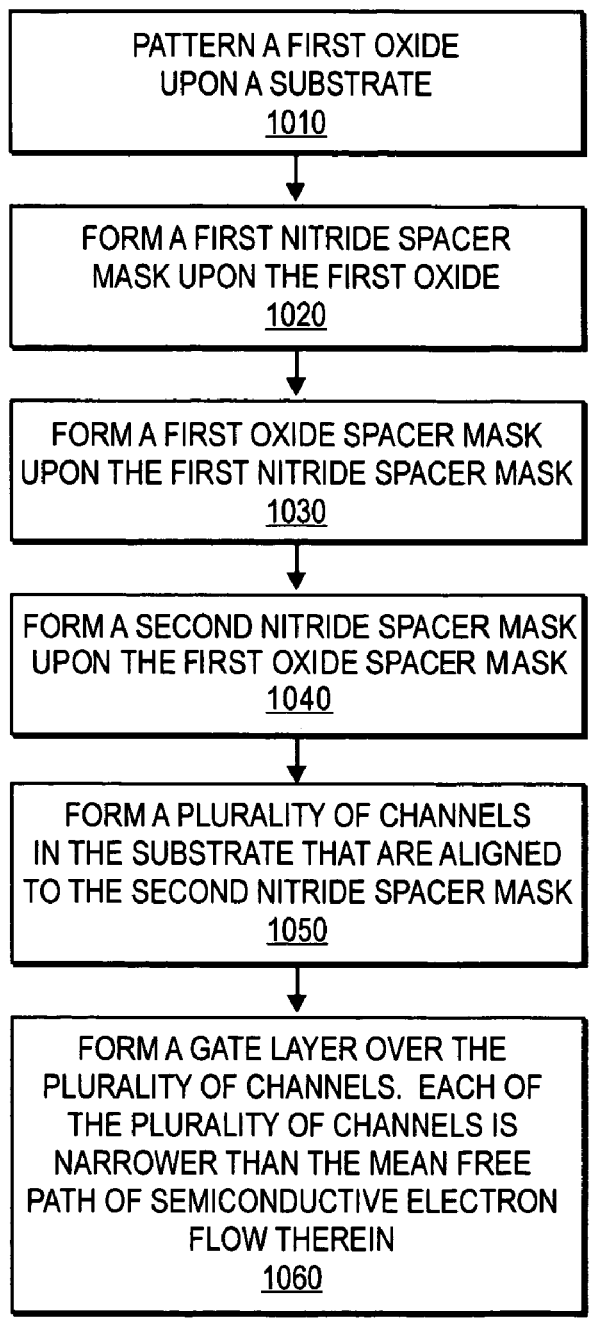
FIG. 10 is a block diagram that illustrates process flow.

FIG. 10 is a process flow diagram that illustrates the inventive method of forming a quantum wire gate. The process 1000 begins at block 1010 with patterning a first oxide upon a substrate. At block 1020 the process continues by forming a first nitride spacer mask upon the first oxide. Next, a first oxide spacer mask is formed at block 1030. The first oxide spacer mask is formed upon the first nitride spacer mask. The process continues at block 1040 by forming a second nitride spacer mask upon the first oxide spacer mask. At block 1050, a plurality of channels is formed in the substrate. The plurality of channels are aligned to the second nitride spacer mask. At block 1060, a gate layer is formed over the plurality of channels. According to the present invention, each of the plurality of channels is narrower than the mean free path of semiconductive electron flow therein.

Distinct advantages exist for the present invention. Because of the scale that has been achieved, the coupling effect of the a first channel gate upon the channel gate opposite thereto in the same quantum wire is synergistically enhanced even with lower gate potentials than are required by the smaller dimensions.

Another advantage exists where the same potential is felt across the gate by electrons that flow within each gate. Thus the potential of electrons in one gate affects the potential of electrons in the counterpart section of the double gate or the triple gate. Consequently, electrons tend to move more toward the middle of the quantum wire and mobility increases because electron flow near a dielectric interface is reduced. The inventive device therefore has about twice the drive current from what is expected. In other words the drive current, instead of being twice the drive current of a single gate device, tends to be closer to about four times the expected drive current for a single gate device.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A method comprising:
   forming a plurality of quantum wires in a substrate, wherein each of the plurality of quantum wires is narrower than the mean free path of semiconductive electron flow therein and wherein a trench is formed between adjacent quantum wires;
   disposing a doping region in the substrate beneath each trench to resist electrical communication between adjacent quantum wires; and
   forming a gate layer over the plurality of quantum wires, wherein a spacer mask is formed between the quantum wire and the gate layer.

2. The method of claim 1, wherein the substrate is made by providing a silicon on insulator substrate, wherein the plurality of quantum wires comprises monocrystalline silicon channels, and wherein the trench is at least as wide as each of the channels.

3. The method of claim 1, wherein the substrate comprises monocrystalline silicon, and wherein the trench is at least as wide as each of the channels.

4. The method of claim 1, further comprising filling the trench with a dielectric.

5. The method of claim 4, wherein the plurality of quantum wires comprises a plurality of double-gate quantum wire field effect transistors.

6. The method of claim 4, wherein the plurality of quantum wires comprises a plurality of triple-gate quantum wire field effect transistors.

* * * * *